United States Patent [19]
Baba et al.

[11] Patent Number: 6,152,568
[45] Date of Patent: Nov. 28, 2000

[54] LIGHTING APPARATUS AND DISPLAY APPARATUS HAVING THE SAME

[75] Inventors: Masaharu Baba, Yokohama; Masato Higano, Tochigi-Ken, both of Japan

[73] Assignee: Toshiba Lighting & Technology Corporation, Tokyo, Japan

[21] Appl. No.: 09/244,640

[22] Filed: Feb. 4, 1999

[30] Foreign Application Priority Data

Feb. 5, 1998 [JP] Japan .................................. 10-024785
Mar. 31, 1998 [JP] Japan .................................. 10-085630

[51] Int. Cl.[7] .......................... G01D 11/28; H01R 13/66; H01J 7/44
[52] U.S. Cl. ............................. 362/23; 362/226; 362/800; 362/489; 315/51; 439/57; 439/620
[58] Field of Search ................................ 257/99; 362/23, 362/226, 800, 489; 439/56, 57, 76.1, 547, 611, 619, 699.2, 620; 315/51

[56] References Cited

U.S. PATENT DOCUMENTS

| | | | |
|---|---|---|---|
| 4,346,329 | 8/1982 | Schmidt | 315/51 |
| 4,725,759 | 2/1988 | Tachikawa | 315/51 |
| 5,087,212 | 2/1992 | Hanami | 439/620 |
| 5,427,532 | 6/1995 | Owen et al. | 439/57 |
| 5,741,058 | 4/1998 | Suzuki et al. | 362/27 |

FOREIGN PATENT DOCUMENTS 2207302  1/1989  United Kingdom ..................... 439/57

*Primary Examiner*—Alan Cariaso
*Attorney, Agent, or Firm*—Oblon, Spivak, McClelland, Maier & Neustadt, P.C.

[57] ABSTRACT

A lighting apparatus such as for a display apparatus equipped for an instrument panel of an automobile, for example, comprises a light source, such as a light-emitting diode, having polarities of substantially a tubular structure having a center axis, a circuit board arranged substantially on the center axis of the light source and electrically connected thereto, a socket body having substantially a cylindrical structure for accommodating the circuit board, and contact terminals accommodated in the socket body and including an inner terminal portion electrically connected to the circuit board through a contact point of the circuit board and an outer terminal portion electrically connected to the inner terminal portion and fixed to the socket body so as to protrude outward the socket body. The circuit board is provided with a flicker element for flickering the light source at 0.5 to 10 Hz controlled by a control unit provided for a printed circuit board of the display apparatus.

14 Claims, 10 Drawing Sheets

LIGHTING APPARATUS AND DISPLAY APPARATUS HAVING THE SAME

BACKGROUND OF THE INVENTION

1. Field of the Invention

The present invention relates to a lighting apparatus and a display apparatus, having the same, suitable as a lamp for illuminating automotive meters, alarm lights, and the like.

2. Prior Art

Conventionally, the lamp socket described in Japanese Utility Model Publication No. HEI 7-22068 (hereinafter referred to as the prior art 1) and a light-emitting diode assembly described in Japanese Utility Model Publication No. HEI 6-17326 (hereinafter referred to the prior art 2) are known as examples of the sockets of the display lamps for the automotive meters, alarm lights, and the like.

The prior art 1 provides a structure in which a lamp socket with an incandescent lamp mounted is inserted into an insertion hole of a printed circuit board to be mounted on the printed circuit board. Because the light source is an incandescent lamp, however, various problems are posed in service life, brightness, temperature, etc., and a maintenance-free configuration is difficult to realize.

In contrast, the prior art 2, which uses a light-emitting diode (hereinafter referred to as LED) having a long service life and high brightness and being superior in cold and heat resistance as a light source, can realize an improved maintenance-free configuration.

The LED has polarities, and therefore, in assembling a pair of contact terminals on a lighting circuit board with the LED mounted thereon, stepped portions of different sizes are formed at the transversely opposite positions of the leading ends of the band-shaped lead pair of the contact terminals so as not to select a wrong polarity, and a pair of mounting holes of the lighting circuit board into which the leading ends of the leads are inserted also have different sizes.

In this prior art 2, however, a fine machining process is required for forming the stepped portions in transversely opposite and different shapes corresponding to the polarities of the LED at the leading ends of a pair of fine leads of the contact terminals. Further, the lead of each contact terminals is so small that it cannot be easily machined, resulting in the problem of low machining workability.

FIG. 11 shows an arrangement of a conventional structure, in which a light emitting diode 1 and a lighting circuit board 3 connected through a pair of lead frames 2a, 2b of the LED 1, which are bent into L-shape. The horizontal portions of the L-shape are inserted through a pair of mounting holes 3a, 3b of the lighting circuit board 3, and the leading ends thereof passing through the holes are fixed by a solder 4 for establishing an electrical and mechanical connection between the LED 1 and the circuit board 3, according to such structure, the center axis Oa of the LED 1 is offset from the center line Ob of the lighting circuit board 3, that is, the center line of the circuit board 3 does not accord with the center axis of the LED 1 in the direction along the thickness of the light circuit board.

As a result, the lower end portion 1a of the LED 1 in the drawing and the insertion hole of a socket body not shown in which the whole of the circuit board 3 is to be inserted become asymmetric. For this reason, the socket body cannot be easily molded, and a die for molding the socket body is complicated, which results a problem of increased cost.

Furthermore, in the use of the LED as mentioned in the above prior arts, since the LED is turned on in a normal manner, it is difficult to clearly inform a user, such as driver of an automobile, of the fact that a certain trouble or inconvenience is caused because, in one reason, an alarm or caution cannot be displayed through a flickering manner of the lighting apparatus.

SUMMARY OF THE INVENTION

An object of the present invention is to substantially eliminate defects or drawbacks encountered in the prior arts mentioned above and to provide a lighting apparatus in which the moldability of the socket body can be simplified, the cost thereof is reduced and the polarity error in an assembling working can be prevented and also provide a display apparatus provided with such lighting apparatus, which is preferably mounted to an automobile or the like.

Another object of the present invention is to provide a lighting apparatus capable of generating an alarm through flickering thereof and also provide a display apparatus provided with the lighting apparatus capable of displaying the alarm to a user with a superior visibility.

These and other objects can be achieved according to the present invention by providing, in one aspect, a lighting apparatus comprising:

a light source, preferably a light-emitting diode (LED) having polarities of substantially a tubular structure having a center axis;

a circuit board arranged substantially on the center axis of the light source and electrically connected thereto;

a socket body having substantially a cylindrical structure for accommodating the circuit board; and contact terminal means accommodated in the socket body and including an inner terminal portion electrically connected to the circuit board through a contact point of the circuit board and an outer terminal portion electrically connected to the inner terminal portion and fixed to the socket body so as to protrude outward the socket body.

In another aspect, there is provided a display apparatus comprising:

a lighting apparatus of the structure mentioned above;

a printed circuit board including an insertion hole through which the socket body is inserted, engaging holes communicating with the insertion hole for engaging the socket body to be detachable and electrodes formed on one surface of a peripheral edge portion of the insertion hole and electrically contacted to the contact terminal means of the lighting apparatus;

a display panel assembled with the printed circuit board and illuminated by the lighting apparatus; and a housing for accommodating the printed circuit board with the lighting apparatus being mounted and the display panel.

In preferred embodiments, the electrical connection between the light source and the circuit board is performed by means of a pair of lead frame members which are juxtaposed along the axial direction of the light source and which have intermediate portions each formed with a curved portion curved in a direction at a right angle to a direction of the juxtaposed arrangement so as to make align the axial directions of the light source and the circuit board.

A pair of engaging portions are formed on an outer surface of the socket body so as to provide mutually different shapes, the engaging portions being engaged with a member to which the socket body is mounted.

The circuit board is provided with flicker means for flickering the light source at 0.5 to 10 Hz. The flicker means is controlled by control means provided for the printed circuit board.

The display apparatus of the structure mentioned above will be preferably applied to an instrument panel of an automobile, for example.

As described above, according to the present invention, the light source and the circuit board are arranged on the same axis, and therefore the insertion hole of the socket body for accommodating them can be formed concentrically. As a result, the insertion hole of the socket body can be formed symmetrically. Thus, the socket body can be easily molded, and the size thereof can be easily taken. The dimensional accuracy can thus be improved while at the same time facilitating the forming of a die for the socket body with a reduced cost.

Furthermore, the lead frames of the light source are curved in the direction perpendicular to the axis thereof, and the leading end of the curved portion is electrically and mechanically connected to the circuit board. Therefore, the light source can be arranged easily coaxially on the circuit board.

The difference in shape of the engaging portions may be set as the corresponding difference in the polarity of the light source in advance. Thus, the polarities of the light source can be easily and accurately recognized by visually checking the difference in shape between the engaging portions.

As a result, when this lighting apparatus is mounted on the printed circuit board, etc. of the display apparatus including an automotive meter or the like, the assembling error, which otherwise might be caused by selecting a wrong polarity, can be prevented from causing.

Furthermore, according to the preferred embodiment of the present invention, the light source, i.e. LED, is made to flicker at 0.5 to 10 Hz by the flicker means provided for the circuit board of the lighting apparatus. Therefore, the user such as operator of an automobile is called to attention. As a result, the light source can be used as a lighting apparatus for an alarm lamp, and the lamp life is so long that a maintenance-free alarm lamp can be realized when the LED is utilized as the light source.

The nature and further characteristic features of the present invention will be made more clear from the following descriptions made with reference to the accompanying drawings.

DESCRIPTION OF THE PREFERRED EMBODIMENTS

Figure 1:
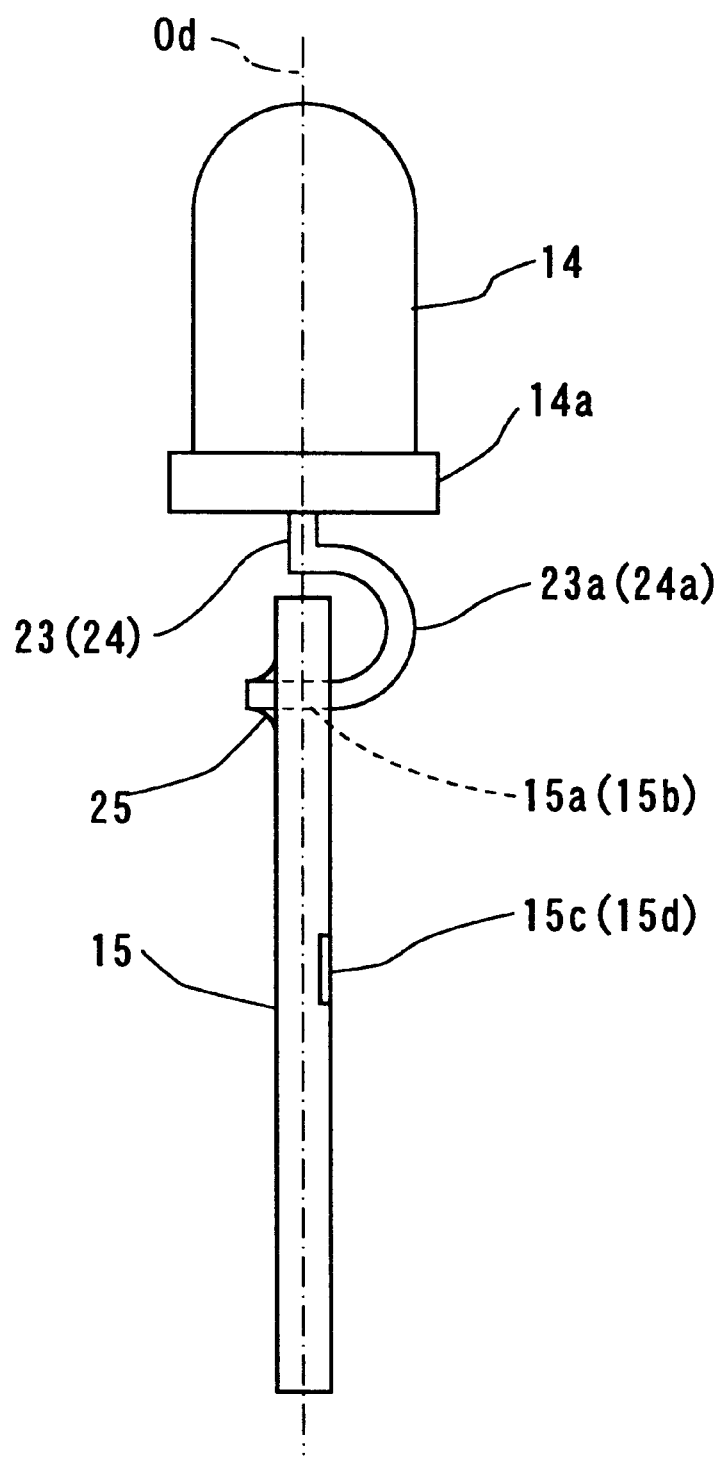
FIG. 1 is an enlarged view of essential parts of an LED and a circuit board arranged as shown in FIG. 3, for example.

Preferred embodiments of the present invention will be explained hereunder with reference to FIGS. 1 to 10, in which the same or equivalent parts are designated by the same reference numerals, respectively.

With reference to FIGS. 1 to 10, a lighting apparatus of one embodiment of the present invention generally comprises a light-emitting diode (LED) 14, a circuit board 15, having a tubular structure, for the LED 14 and a socket body 12 also having a cylindrical structure formed of, for example, 66-Nylon resin or the like material having an electrically insulating property. The LED 14 has a base end portion 14a, lower end as viewed in FIG. 1, which is inserted in an insertion hole 13 of the socket body 12 together with the circuit board 15. The circuit board 15 provided with a lighting circuit for the LED 14, and circuit parts such as resistors and capacitors are mounted on one or both surfaces thereof though not shown.

The lighting circuit of the circuit board 15 may be provided with a flicker means F (FIG. 3, but the locating position thereof is optional), for displaying a required alarm, which will be mentioned more in detail herein latter.

The socket body 12 is inserted into a circular insertion hole of a printed circuit board for automotive meters and the like described later, in which a cylindrical insertion portion 16 protruded to a side of the printed circuit board is integrated in the axial direction concentrically with a holding knob 18 of the socket body protruded with an outward flange 17 having a diameter larger than the cylindrical insertion portion 16.

The outward flange 17 is formed with outer terminals 19a, 20a of a pair of conductive, elastic and thin tubular contact terminals 19, 20 in an opposed relation to each other diametrically of the socket body 12.

Figure 3:
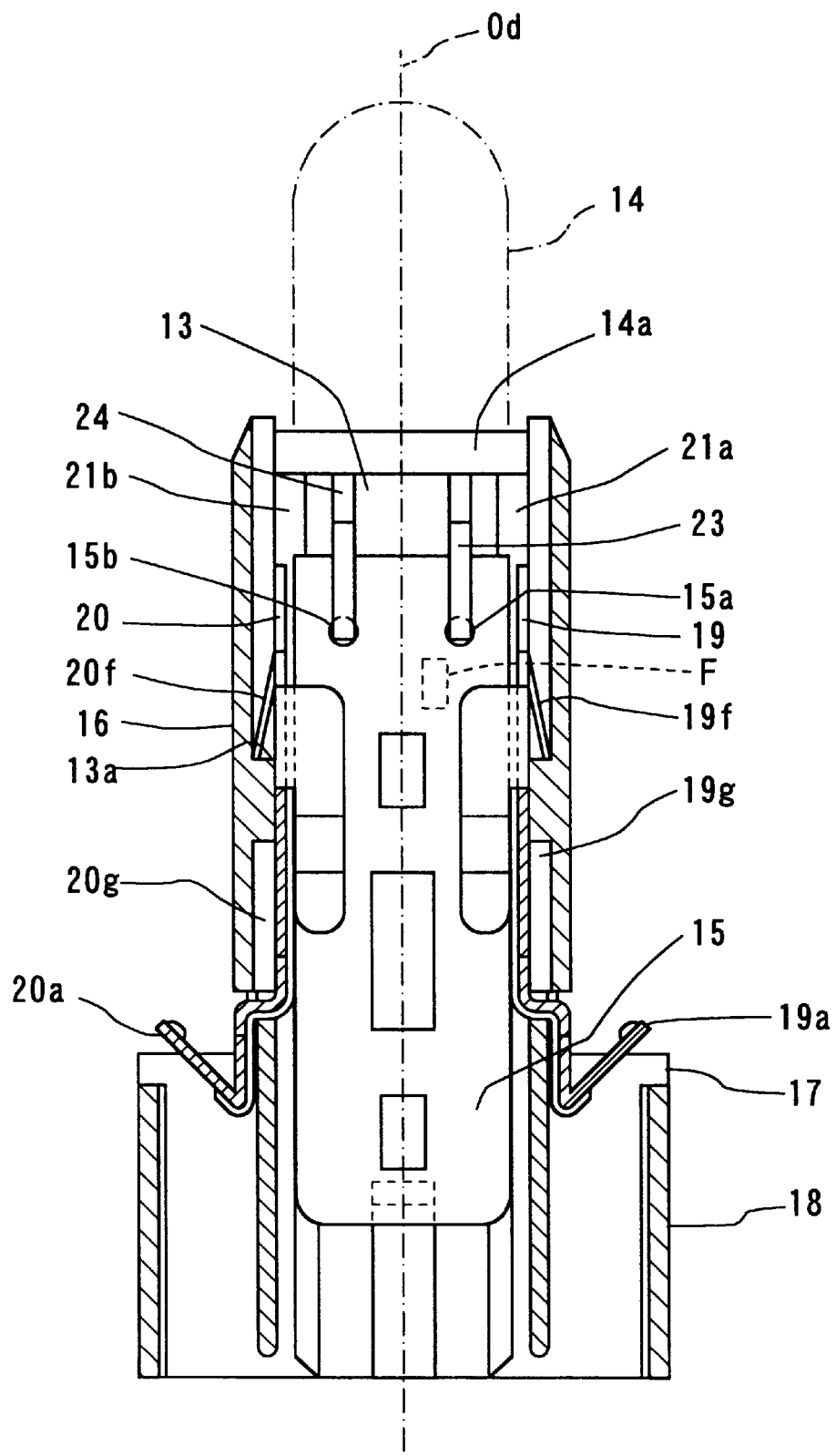
FIG. 3 is a sectional view taken along the line III—III in FIG. 2.

As shown in FIG. 3, the socket body 12 has a pair of guide grooves 21a, 21b juxtaposed in the axial direction by which the pair of the thin tubular contact terminals 19, 20 are fitted inward from the bottom surface of the socket body 12 along the two diametrically opposed inner side surfaces of the insertion hole 13.

Figure 6:
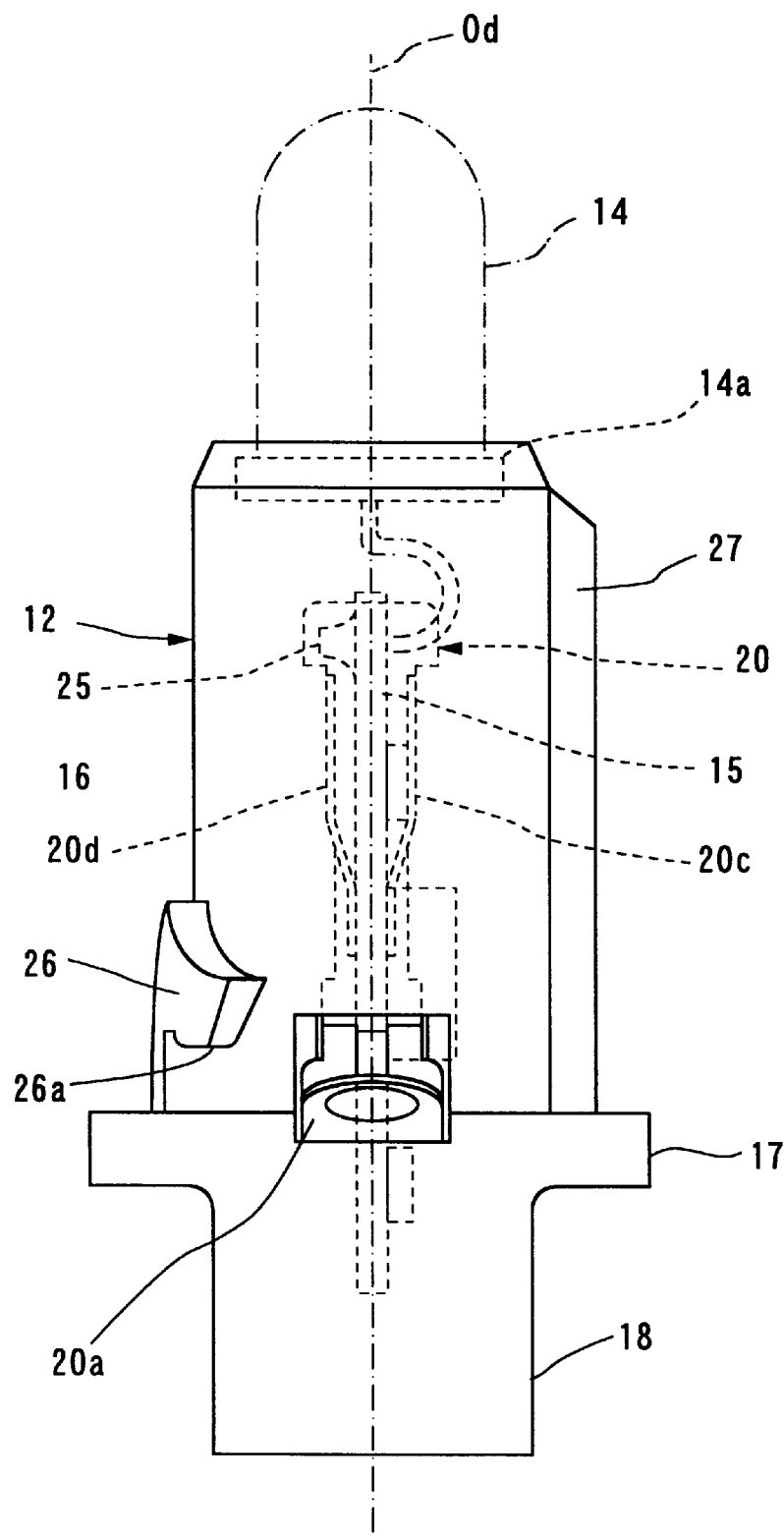
FIG. 6 is a view taken along an arrow VI in FIG. 2.
Figure 7:
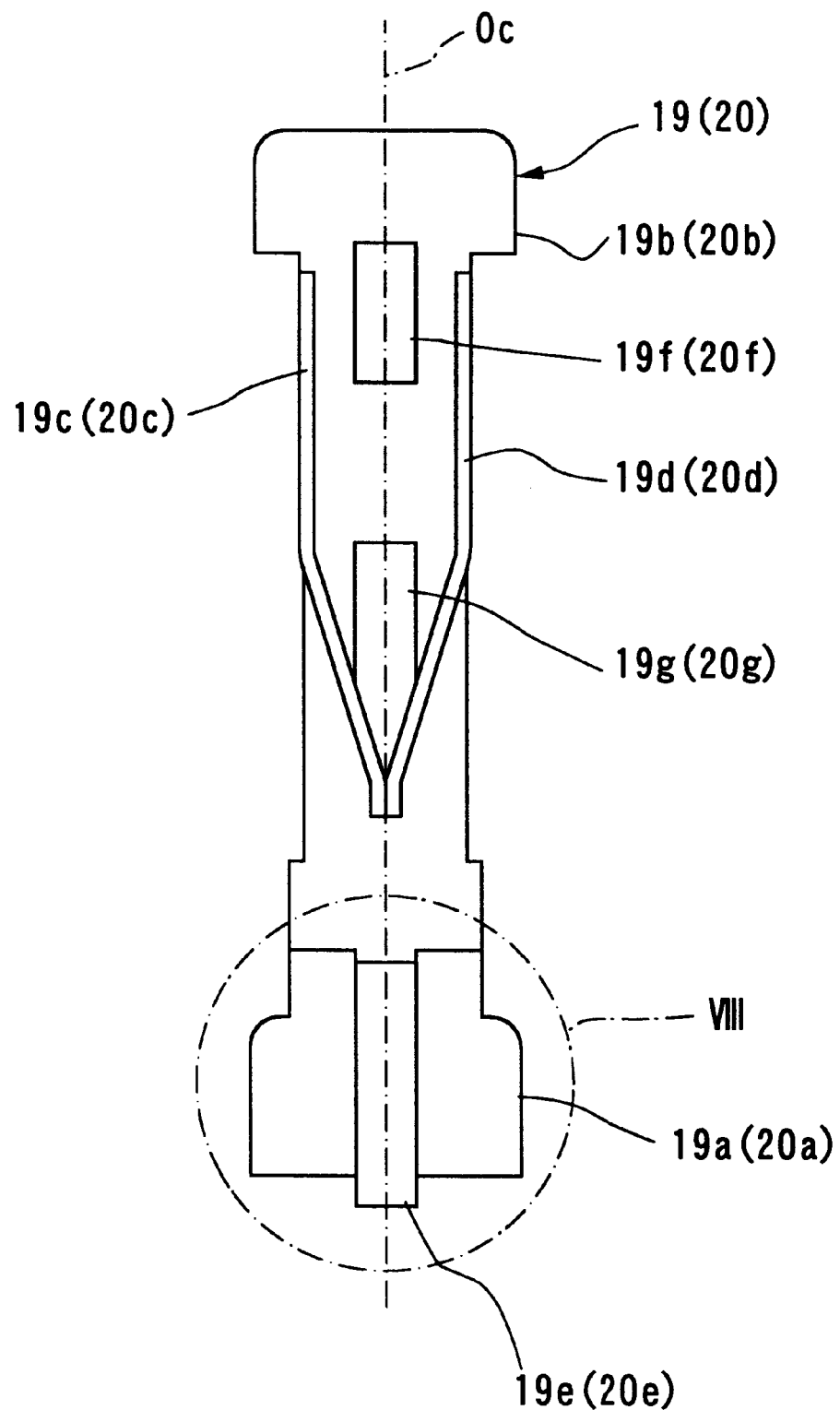
FIG. 7 is a rear view of contact terminals shown in FIG. 3, for example.

FIG. 7 is a front view of the above-mentioned contact terminals 19, 20, and the upper part of the bodies 19b, 20b thereof is integrally formed with a set of elastic tongues 19c, 19d; 20c, 20d constituting an inner terminal portion rising substantially at right angles to the surface of FIG. 7 from the horizontal side edges in the drawing. The lower parts of the elastic tongues 19c, 19d; 20c, 20d in FIG. 7 are separated from the side edges of the contact terminal bodies 19b, 20b, bent toward the center axis Oc of the terminal bodies 19b, 20b, respectively, and elastically brought into contact to each other on the center axis Oc. In this way, as shown by dashed lines in FIG. 6, the transverse sides of the circuit board 15 are elastically supported along the thickness thereof with the pairs of the elastic tongues 19c, 19d; 20c, 20d.

Figure 8:
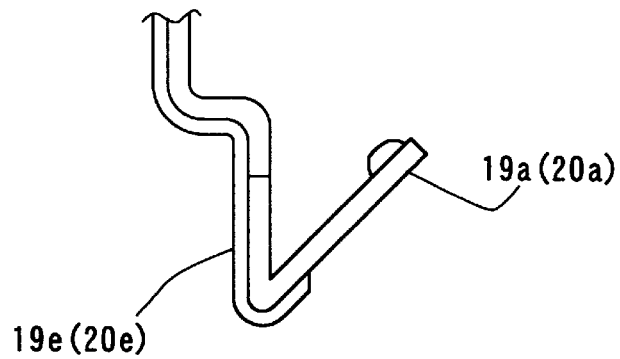
FIG. 8 is a side view of a part indicated by VIII in FIG. 7.

Each lower end portion of the contact terminal bodies 19b, 20b is formed integrally with outer terminals 19a, 20a bent outward. These outer terminals 19b, 20b are arranged in a state protruded outward on the flange 17 of the socket body 12 as described above. As shown in FIG. 8, beads 19e, 20e are formed substantially over the entire length of the back of the transverse intermediate portion of each outer terminal 19a, 20a thereby to increase the mechanical strength of the outer terminals 19a, 20a, respectively.

Furthermore, as shown in FIG. 7, the contact terminals 19, 20 are formed with raised tongues 19f, 20f at the upper parts of the terminal bodies 19b, 20b, respectively, while engaging protrusions 19g, 20g protruded outward from the bottom in FIG. 7 are integrally formed at the lower portion thereof, and the lower ends of the raised tongues 19f, 20f are protruded outward in FIG. 7.

Figure 5:
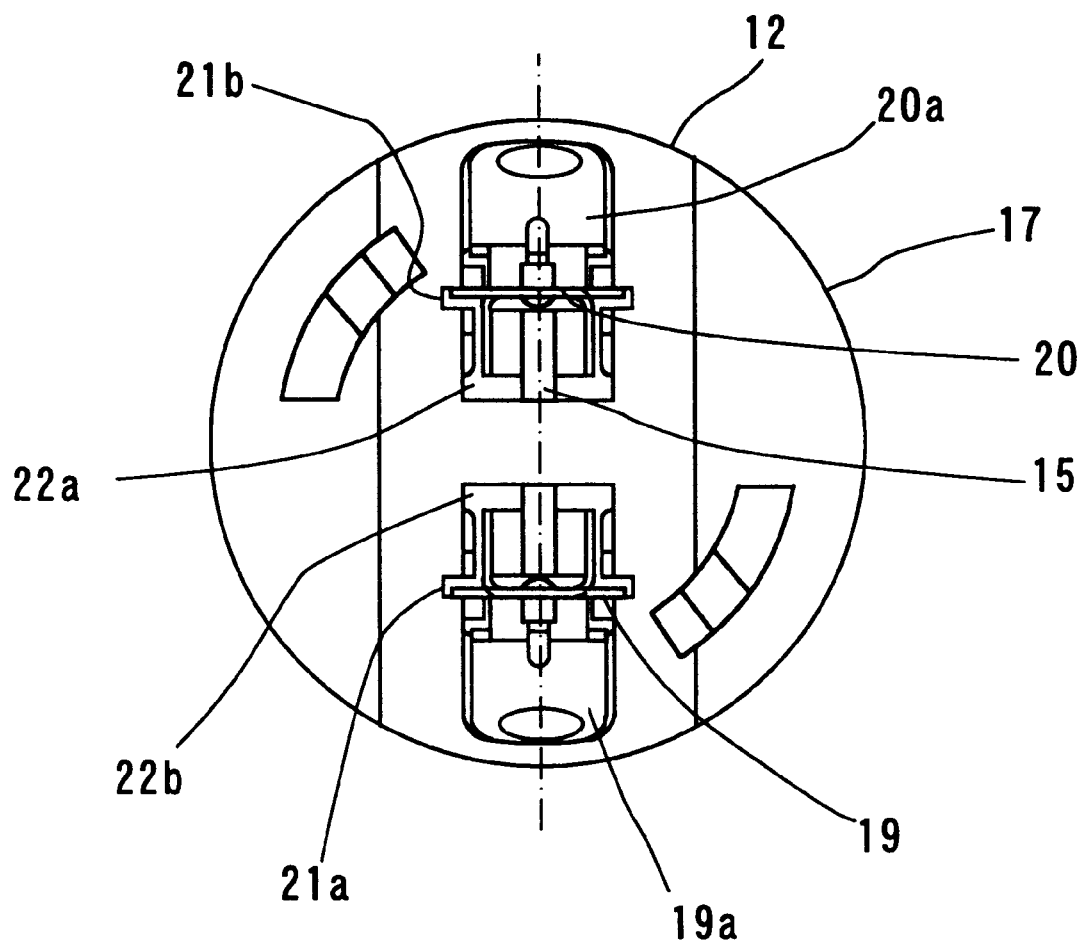
FIG. 5 is a bottom view of FIG. 2.

The contact terminals 19, 20 configured in this way are inserted axially into a pair of guide grooves 21a, 21b from a pair of bottom openings 22a, 22b, respectively, of the socket body 12 shown in FIG. 5. As shown in FIG. 3, the lower ends in the drawing of the raised tongues 19f, 20f open outward and are engaged with the upper surface of an annular protrusion 13a in FIG. 3 when they have ridden over, upward in FIG. 3, the annular protrusion 13a is somewhat protruded inward at the axially intermediate portion of the insertion hole 13 in the socket body 12. At the same time, the protruded upper ends of the engaging protrusions 19g, 20g come into contact with the lower surface of the annular protrusion 13a in FIG. 3. As a result, the annular protrusion 13a is held by the engaging protrusions 19g, 20g and the raised tongues 19f, 20f, thereby fixing the contact terminals 19, 20 in the socket body 12.

As shown in FIG. 1, the LED 14 is fixed on the circuit board 15 on the center axis Od in the axial direction. Specifically, the LED 14 has a pair of axially juxtaposed lead frames 23, 24 formed with semicircular curved portions 23a, 24a expanding orthogonally outward from the center axis Od. The forward ends of the curved portions 23a, 24a, also as shown in FIG. 3, are inserted into a pair of mounting holes 15a, 15b of the circuit board 15 and the forward ends of the inserted portions protruded from the back thereof are fixed by a solder fillet 25, so that the LED 14 is arranged coaxially and electrically connected on the circuit board 15. The lead frames may take other shapes as far as they maintain the axial alignment of the LED 14 and the circuit board 15.

Furthermore, the circuit board 15 has, on one of the surfaces thereof, a pair of contacts 15c, 15d formed in a spaced relation with each other in substantially the same plane at the right and left sides portions of the axially intermediate portion. These contacts 15c, 15d are electrically connected to the pair of the mounting holes 15a, 15b through the lighting circuit of the circuit board 15.

As described above, the circuit board 15 with the LED 14 mounted coaxially thereon is inserted into the insertion hole 13 from the upper side thereof in FIG. 3 after the pair of the contact terminals 19, 20 are mounted in the insertion hole 13 of the socket body 12. Then, the transverse edge portions of the circuit board 15 are inserted while being guided into the gaps between the elastic tongue pairs 19c, 19d; 20c, 20d of the contact terminals 19, 20, respectively. When the circuit board 15 is inserted strongly against the elasticity of the lower closed leg portions of the elastic tongues 19, 20, as shown by dashed lines in FIG. 6, the transverse edge portions of the circuit board 15 are elastically held along the thickness of the circuit board by the elastic tongues 19c, 19d; 20c, 20d, respectively. At the same time, the inner surface of the forward end portion of one of the elastic tongue pairs, for example, 19g, 20g, is pressed elastically against and electrically connected with the contact pair 15c, 15d located in the same plane on the circuit board 15.

Figure 2:
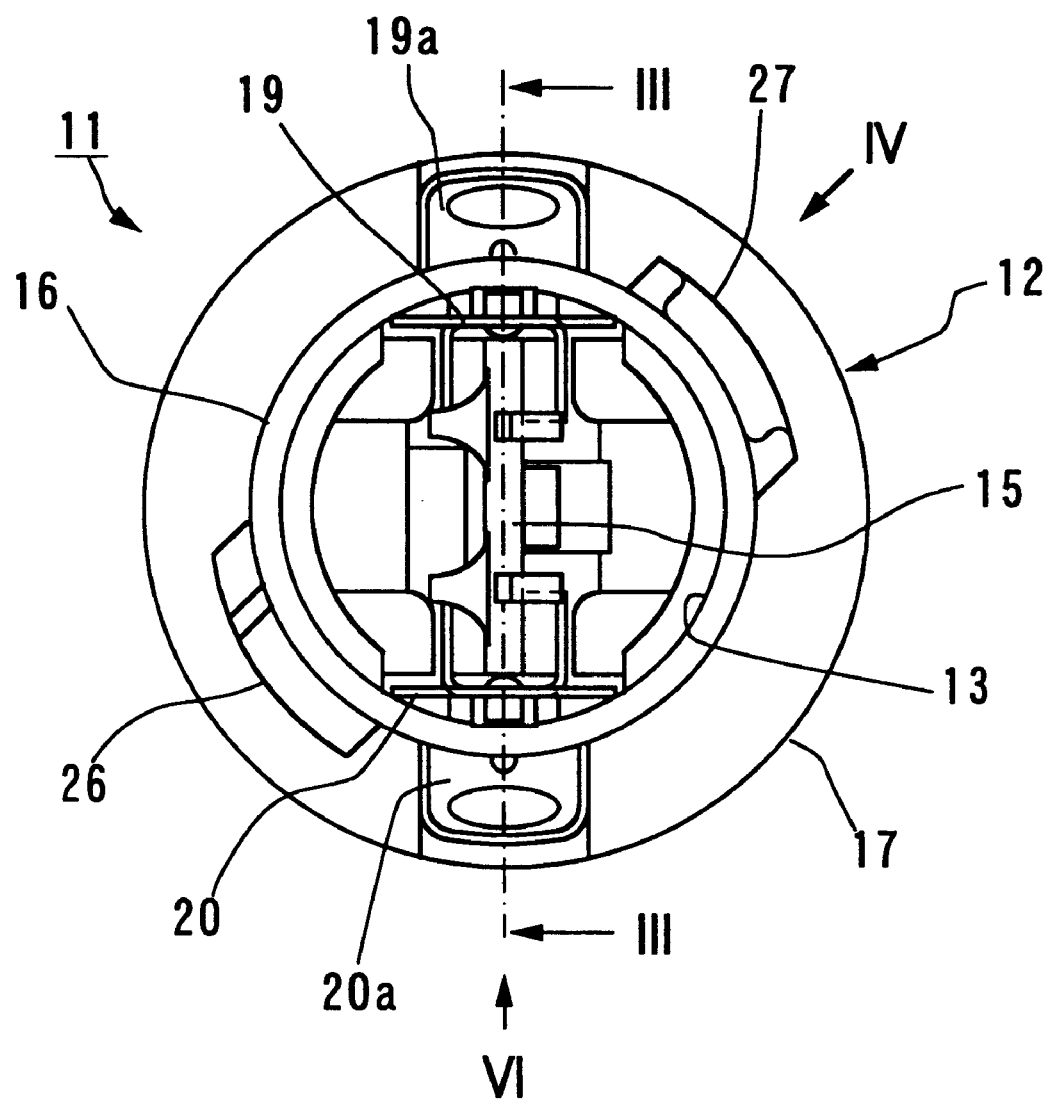
FIG. 2 is a partially-cutaway plan view of a lighting apparatus according to a first embodiment of the present invention.
Figure 4:
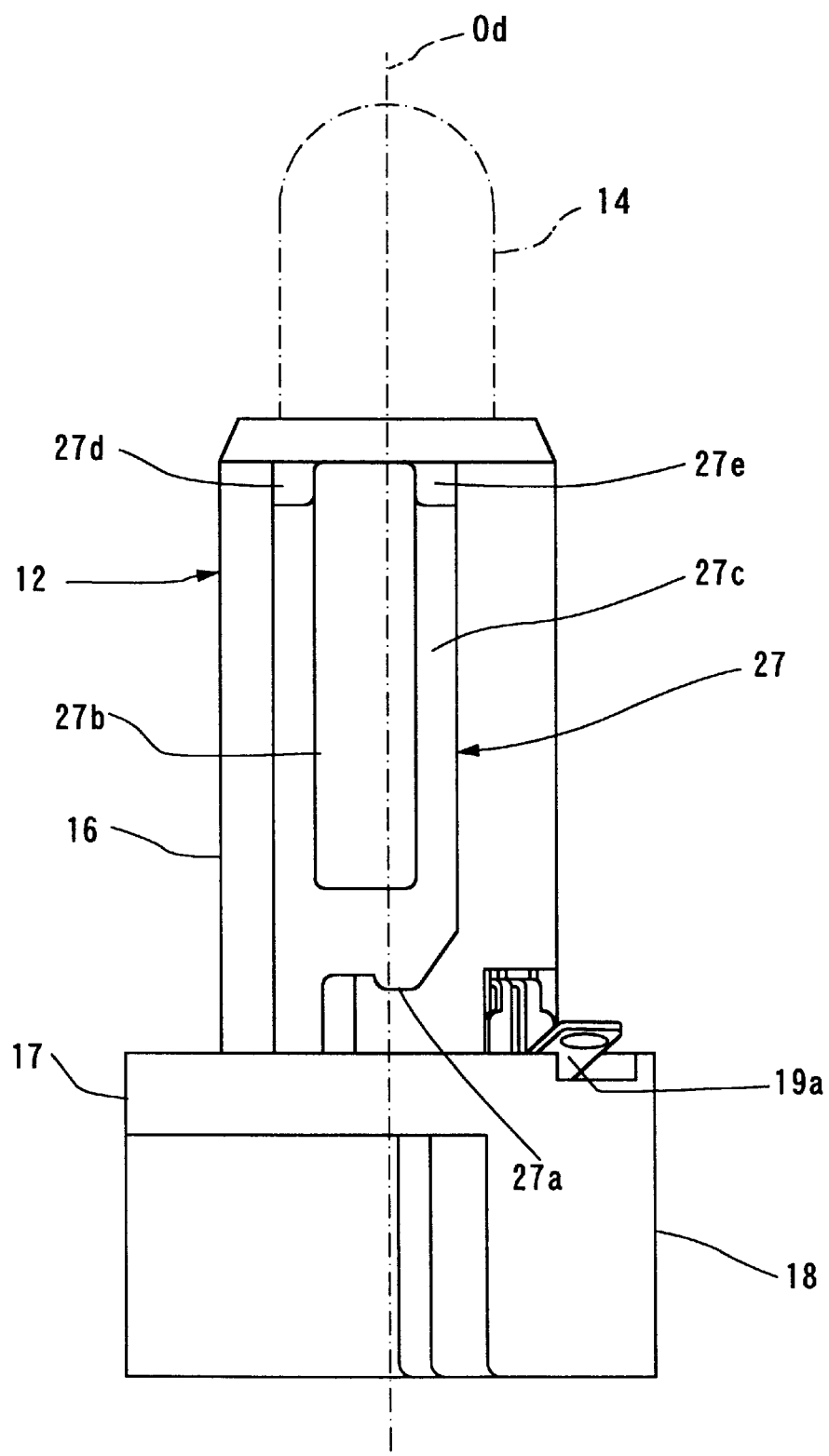
FIG. 4 is a view taken along an arrow IV in FIG. 2.
Figure 9A:
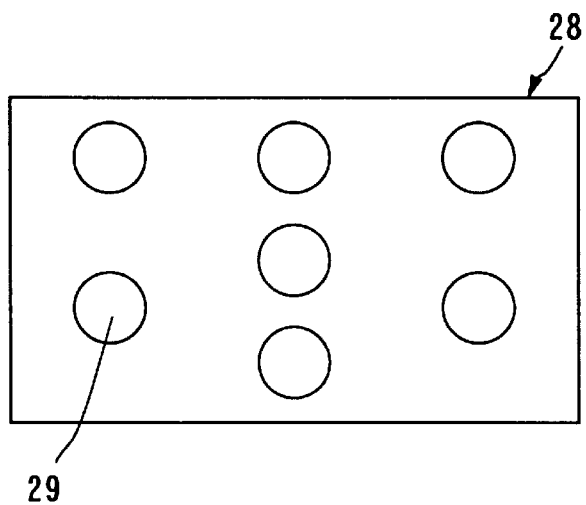
FIG. 9A is an illustration of a printed circuit board having insertion holes into which the sockets of the lighting apparatus are inserted and FIG. 9B is an enlarged plan view of parts around one insertion hole of the printed board shown in FIG. 9A.
Figure 9B:
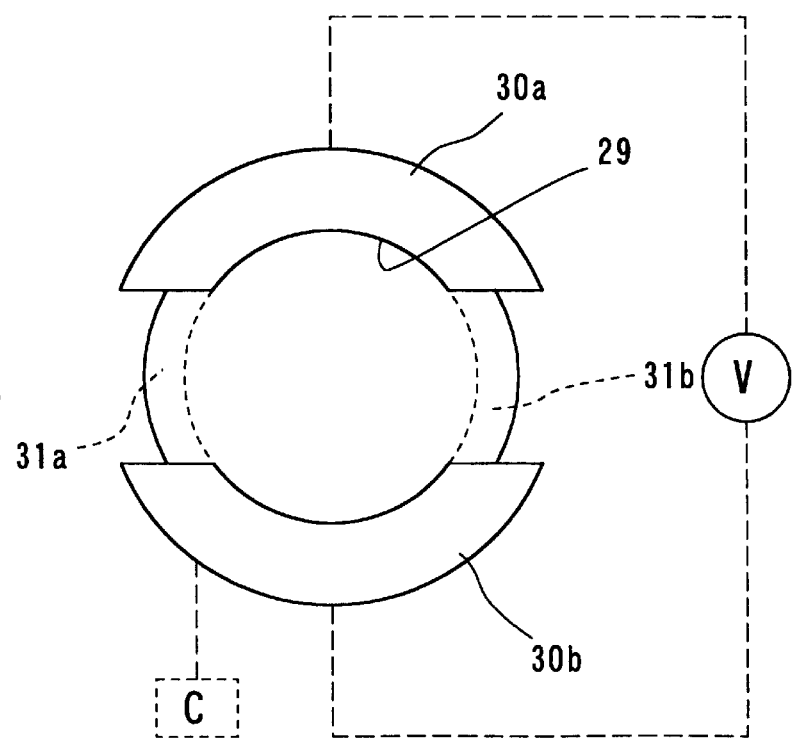

As shown in FIGS. 2, 4, and 6, a pair of engaging portions 26, 27 are protruded at substantially diametrically opposed positions on and integrally with the flange 17 protruded outward on the outer side surface of a cylindrical insertion portion 16 of the socket body 2. As shown in FIGS. 4 and 6, the engaging potions 26, 27 each are formed with openings 26a, 27a on one side thereof, respectively, into which a peripheral edge portion of the opening of an insertion hole 29 of a printed circuit board 28 for the automotive meters or the like shown in FIG. 9 is fitted. With the cylindrical insertion portion 16 inserted in the insertion hole 29 of the printed circuit board 28, the socket body 12 is rotated about the axial center thereof. In this way, the peripheral edge portion of the insertion hole 29 is fitted in the openings 26a, 27a of the engaging portions 26, 27, respectively, so that the lighting apparatus 11 is detachably mounted on the printed circuit board 28.

One of the engaging portions, i.e. the engaging portion 27 is formed, to be larger, in a different shape from the other portion 26. These engaging portions 26, 27 are set in a polarity corresponding to that of the LED 14 in advance, whereby the difference in shape between the engaging portions 26, 27 and the polarity of each of the external terminals 19a, 20a in the neighborhood of the engaging portions 26, 27 can be visually recognized easily and positively.

Furthermore, as shown in FIG. 4, the large engaging portion 27 has an upper end portion thereof integrally protruded therewith and forked into two portions, i.e. a pair of insertion guides 27b, 27c extending substantially in parallel to the axial direction. The leading end insertion portions are also formed with tapers 27d, 27e, respectively. When the socket with the lighting apparatus 11 is inserted into the insertion hole 29 of the printed circuit board 28, it is guided in the insertion direction by the protruded insertion guides 27b, 27c.

Further, as shown in FIG. 9, the printed circuit board 28 formed with an insertion hole 29 into which the cylindrical insertion portion 16 of the socket body 12 is to be inserted. At the same time, a pair of arcuate electrode portions 30a, 30b are formed in diametrically opposed relation to each other on one surface of the peripheral edge portions of the insertion hole 29. Moreover, insertion holes 31a, 31b in which a pair of engaging portions 26, 27 of the socket body 12 are to be inserted are formed between the electrodes 30a, 30b integrally therewith.

Consequently, in the case where the lighting apparatus 11 is inserted in the insertion hole 29 of the printed circuit board 28, the first step is to visually check the shape of a pair of the engaging portions 26, 27 of the lighting apparatus 11, then confirm the polarities of a pair of the outer terminals 19a, 20a in the neighborhood of the engaging portions 26, 27, respectively, and make sure that they are coincident with the polarities of a pair of the electrodes 30a, 30b of the printed circuit board 28.

Next, the cylindrical insertion portion 16 of the lighting apparatus 11, when inserted into the insertion hole 29 of the printed circuit board 28, is guided in the axial direction thereof by the insertion guides 27b, 27c of the socket body 12. When the cylindrical insertion portion 16 thus inserted reaches the flange 17 of the socket 12, the socket body 12 is rotated about the axial center thereof. Then, the openings 26a, 27a of the engaging portions 26, 27 of the socket body 12 are fitted with a pair of electrodes 30a, 30b of the printed circuit board 28, and thus fixedly held between the front and back portions thereof. As a result, a pair of the outer terminals 19a, 20a of the light source apparatus 11 are closely brought into contact and electrically connected with a pair of the electrodes 30a, 30b, respectively, of the printed circuit board 28.

In addition, with the lighting apparatus 11 mounted in the insertion hole 29 of the printed circuit board 28, the pair of the external terminals 19a, 20a and the pair of the electrodes 30a, 30b coincide in polarity with each other as described above. Therefore, if one of the electrodes 30a, 30b, for example 30a, is positive, the current from the positive electrode flows first to the outer terminal 19a in contact to the positive electrode 30a. Thereafter, the current flows through the lighting circuit not shown in the circuit board 15, the lead frame 23 of the LED 14, the LED 14, the other lead frame 24 and the other outer terminal 20a to the negative electrode 30b of the printed circuit board 28 again, thereby turning on the LED 14, for example, in the flickering manner by the flickering means F provided for the circuit board 15, as mentioned hereinlater.

According to this embodiment, the LED 14 and the circuit board 15 are arranged on the same axis, and therefore, the insertion hole 13 of the socket body 12 for accommodating them can be formed concentrically. As a result, the socket body 12 can be formed symmetrically and thus can be molded easily. In addition, the size of the socket body 12 is easily taken. Thus, the dimensional accuracy can be improved, while forming the die of the socket body 12 easily for a reduced cost.

Furthermore, the pair of the lead frames 23, 24 of the LED 14 are curved, and the leading end portions of the curves portions are inserted fixedly into the mounting holes 15a, 15b of the circuit board 15 for establishing electrical and mechanical connection. The LED 14 can thus be easily arranged so that the central axis thereof substantially accord with the center line of the circuit board 15.

Further, the pair of the engaging portions 26, 27 formed on the outer peripheral portion of the socket body 12 have different sizes and shapes. Therefore, by setting the engaging portions 26, 27 to correspond to those of the LED 14 in polarities in advance, the polarities of the lighting apparatus can be visually recognized easily and positively by visually checking the difference in shape between the engaging portions 26, 27.

When mounting the lighting apparatus 11 in the insertion hole 29 or the like of the printed circuit board 28 of the display apparatus such as an automotive meter, the mounting error can thus be prevented from causing which otherwise might be caused by selecting a wrong polarity.

Since the pair of the contact terminals 19, 20 are symmetric, they can be easily mass-produced as compared with a case where they are not symmetric.

Furthermore, the elastic tongues 19c, 19d; 20c, 20d constituting the internal terminal portions of the contact terminals 19, 20 are electrically connected by being elastically pressed against the contacts 15c, 15d of the circuit board 15. Therefore, unlike when the elastic tongues 19c, 19d; 20c, 20d are fixed by soldering to the contacts 15c, 15d of the circuit board 15, according to the present invention, the circuit board 15 is less thermally affected at the time of soldering. Thus, an electrical connection can be accurately accomplished, and the assembling working can be made simplified.

As briefly mentioned before, the lighting circuit of the circuit board 15 may be provided with the flicker means F,
such as shown in FIG. 3, for displaying a required alarm by executing a mode of supplying a DC power of 0.5 to 10 Hz per second, preferably about 2.5 Hz, for example, to the LED 14 in response to a flicker command signal from the control means mounted on the the printed circuit board 28 of an automotive meter or the like described latter. Further, in FIG. 9, reference character V denotes a DC power source and reference character C denotes the control means, which may be provided for the circuit board 15 of the lighting apparatus.

When supplied with a flicker command signal from the control means C, the circuit board 15 causes the LED 14 to flicker at 0.5 to 10 Hz with the ON-OFF time ratio of 51:49, for example, for a predetermined length of time, thereby calling an attention to an operator of an automobile, for example, with some alarm.

The value for the flickering of 0.5 to 10 Hz is determined in consideration of preferred visual observing ability of the operator, and in the case of less than 0.5 Hz or more than 10 Hz per second, it will be insufficient for the operator to be alarmed by the flickering of the lighting apparatus.

A display apparatus according to another embodiment of the present invention is constructed in the manner mentioned above.

Figure 10:
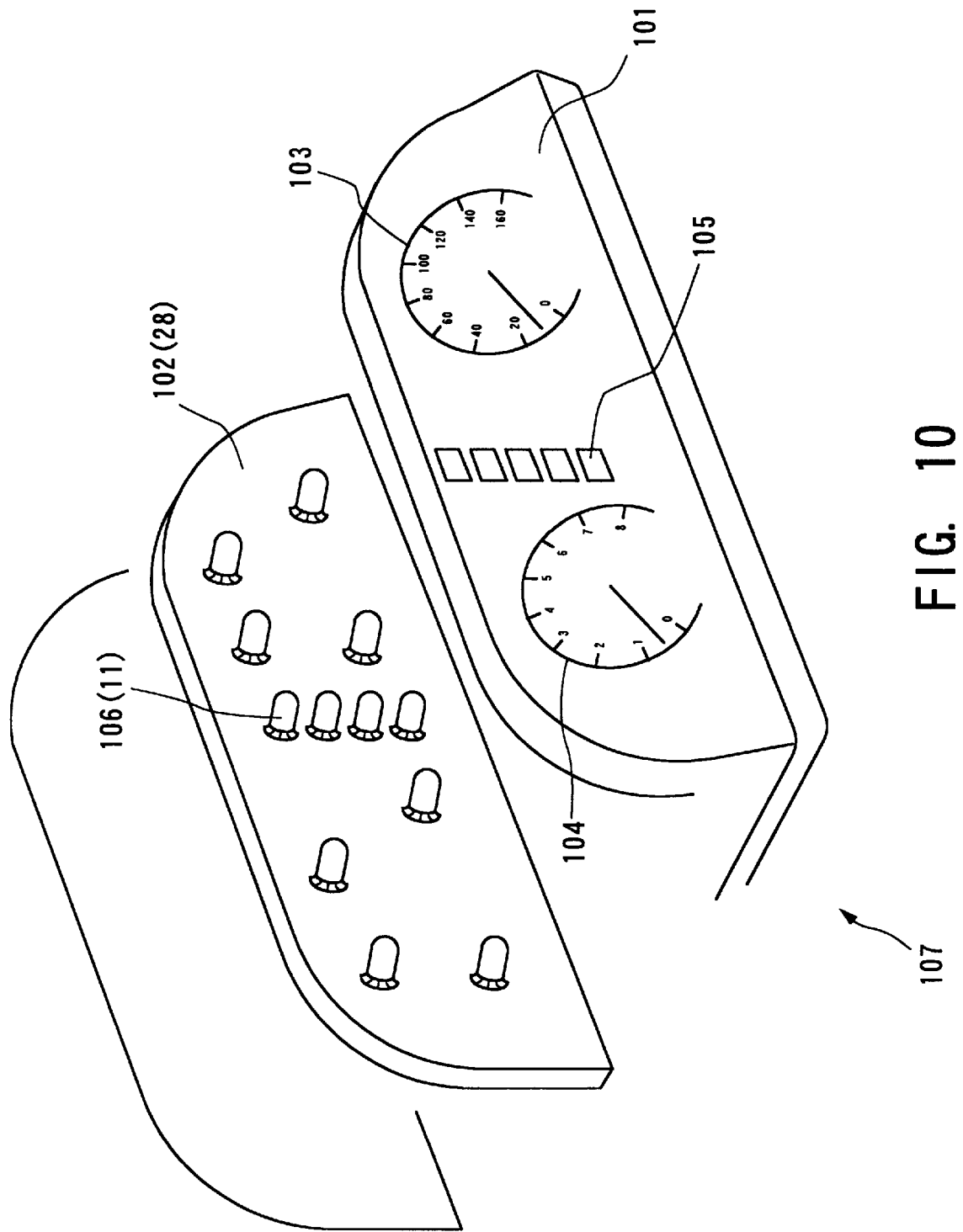
FIG. 10 is a schematic perspective view of a display apparatus according to another embodiment of the present invention, such as instrument panel equipped for an automobile.
Figure 11:
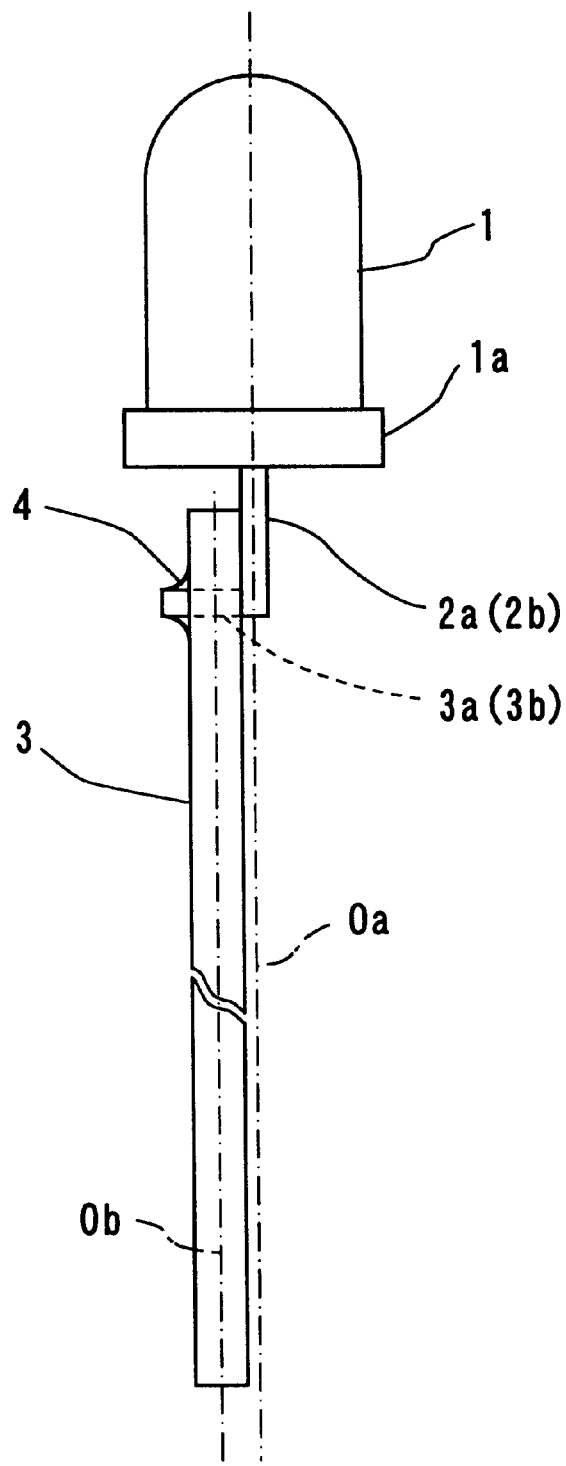
FIG. 11 is schematic view showing an arrangement of an LED and a circuit board of a conventional lighting apparatus.

That is, with reference to FIG. 10 showing a schematic perspective view of a display apparatus 100, the display apparatus 100 comprises a display panel 101 to which various meters 103, 104 such as speed meter, are mounted, and a printed circuit board 102 as an instrument panel, corresponding to the printed circuit board 28 mentioned hereinbefore, to which lighting apparatus 106 corresponding to the lighting apparatus 11 mentioned hereinbefore are mounted. The display panel 101 and the printed circuit board 102 are housed in a housing 107, thus constituting the display apparatus 100.

When the lighting apparatus 106 (11) is turned on or off, in the flickering manner, for example, is observed by the operator through display means 105 formed to the display panel 101.

In the example provided with the flicker means of the structure mentioned hereinbefore, when the circuit board 15 of the lighting apparatus 11 is supplied with a flicker command signal from the control means C, the circuit board 15 causes the LED 14 to flicker at 0.5 to 10 Hz with the ON-OFF time ratio of 51:49, for example, for a predetermined length of time, thereby calling an attention to the operator through the flickering displayed on the display panel 101 of the display apparatus. Further, since the LED 14 is made to flicker at 0.5 to 10 Hz always as long as it is turned on or as required, it is possible to call the attention to the operator and let him visually recognize the flickering as an alarm with a suitable visibility.

In the case where the lighting apparatus 11 (105) having the configuration mentioned above is assembled with the printed circuit board of the display apparatus by being inserted into the insertion hole 29 of the printed circuit board 28 of the display apparatus, the polarities of the pair of the external terminals 19a, 20a located in the neighborhood of the engaging portions 26, 27 can be checked by visually checking the difference in shape between the pair of the engaging portions 26, 27 of the lighting apparatus 11, and thus, the coincidence in polarity with the pair of the electrode portions 30a, 30b of the printed circuit board 28 can be confirmed. Then, the cylindrical insertion portion 16 of the lighting apparatus 11, upon insertion into the insertion hole 29 of the printed circuit board 28, is guided in the axial direction by the insertion guides 27b, 27c of the socket body 12. Thus, when the cylindrical insertion portion 16 reaches the flange 17 of the socket body 12, the socket body 12 is rotated about the axial center thereof, so that the openings 26a, 27a of the engaging portions 26, 27 of the socket body 12 are fitted in the pair of the electrode portions 30a, 30b of the printed circuit board 28 and held fixedly between the front and back thereof. As a result, the pair of the outer terminals 19a, 20a of the lighting apparatus 11 are brought into close contact to and electrically connected with the pair of the electrodes 30a, 30b of the printed circuit board 28, respectively.

According to the embodiment of the present invention mentioned above, it may be said that the lighting apparatus includes the printed circuit board.

Consequently, in this display apparatus, the insertion of the lighting apparatus 11 into the insertion hole 29 of the printed circuit board 28 can be smoothed by means of the insertion guides 27c, 27d, and in addition, the polarities of the LED 14 can be recognized visually from the difference in shape between the pair of the engaging portions 26, 27. Thus, the error in the assembling working on the printed circuit board 28 can be prevented.

Further, the die cost of the socket body 12 of the lighting apparatus 11 can be reduced, and hence the cost of the display apparatus can be decreased either.

It is to be noted that the present invention is not limited to the described embodiments and many other changes and modifications may be made without departing from the scopes of the appended claims.

What is claimed is:

1. A lighting apparatus comprising:
    a light source having polarities of substantially a tubular structure having a center axis;
    a socket body having substantially a cylindrical structure and disposed in alignment with the light source;
    a circuit board, which is electrically connected to the light source, arranged disposed inside the socket body so as to transverse an inner central portion thereof and substantially linearly aligned with the center axis of the light source; and
    contact terminal means accommodated in the socket body and including an inner terminal portion electrically connected to the circuit board through a contact point of the circuit board and an outer terminal portion electrically connected to the inner terminal portion and fixed to the socket body so as to protrude outward the socket body.

2. A lighting apparatus according to claim 1, wherein said electrical connection between the light source and the circuit board is performed by means of a pair of lead frame members which are juxtaposed along the axial direction of the light source and which have intermediate portions each formed with a curved portion curved in a direction at right angles to a direction of the juxtaposed arrangement so as to make align the axial directions of the light source and the circuit board.

3. A lighting apparatus according to claim 1, wherein a pair of engaging portions are formed on an outer surface of the socket body so as to provide mutually different shapes, said engaging portions being engaged with a member to which the socket body is mounted.

4. A lighting apparatus according to claim 1, wherein said light source comprises a light-emitting diode.

5. A lighting apparatus according to claim 1, wherein said circuit board is provided with flicker means for flickering the light source at 0.5 to 10 Hz.

6. A display apparatus comprising:
    a lighting apparatus including a light source having polarities of substantially a tubular structure having a center axis, a circuit board arranged substantially on the center axis of the light source and electrically connected thereto, a socket body having substantially a cylindrical structure for accommodating the circuit board, and contact terminal means accommodated in the socket body;
    a printed circuit board including an insertion hole through which the socket body is inserted, engaging holes communicating with the insertion hole for engaging the socket body to be detachable and electrodes formed on one surface of a peripheral edge portion of the insertion hole and electrically contacted to the contact terminal means of the lighting apparatus;
    a display panel assembled with the printed circuit board and illuminated by the lighting apparatus; and
    a housing for accommodating the printed circuit board with the lighting apparatus being mounted and the display panel.

7. A display apparatus according to claim 6, wherein said electrical connection between the light source and the circuit board is performed by means of a pair of lead frame members which are juxtaposed along the axial direction of the light source and which have intermediate portions each formed with a curved portion curved in a direction at a right angle to a direction of the juxtaposed arrangement so as to make align the axial directions of the light source and the circuit board.

8. A display apparatus according to claim 6, wherein a pair of engaging portions are formed on an outer surface of the socket body so as to provide mutually different shapes, said engaging portions being engaged with a member of the printed circuit board, said member being formed with engaging openings with which said engaging portions are engaged.

9. A display apparatus according to claim 6, wherein said light source comprises a light-emitting diode.

10. A display apparatus according to claim 6, wherein said circuit board is provided with flicker means for flickering the light source at 0.5 to 10 Hz.

11. A display apparatus according to claim 10, wherein said flicker means is controlled by control means provided for the printed circuit board.

12. A display apparatus according to claim 6, wherein said display panel comprises a meter instrument panel of an automobile.

13. A lighting apparatus comprising:
    a light source having polarities of substantially a tubular structure having a center axis;
    a circuit board arranged substantially on the center axis of the light source and electrically connected to the light source;
    a socket body having substantially a cylindrical structure for accommodating the circuit board; and
    contact terminal means accommodated in the socket body and including an inner terminal portion electrically connected to the circuit board through a contact point of the circuit board and an outer terminal portion electrically connected to the inner terminal portion and fixed to the socket body so as to protrude outward the socket body,
    wherein said electrical connection between the light source and the circuit board is performed by means of a pair of lead frame members which are juxtaposed along the axial direction of the light source and which have intermediate portions each formed with a curved portion curved in a direction at a right angle to a direction of the juxtaposed arrangement so as to align the axial directions of the light source and the circuit board.

14. A lighting apparatus comprising:

a light source having polarities of substantially a tubular structure having a center axis;

a circuit board arranged substantially on the center axis of the source and electrically connected to the light source;

a socket body having substantially a cylindrical structure for accommodating the circuit board; and contact terminal means accommodated in the socket body and including an inner terminal portion electrically connected to the circuit board through a contact point of the circuit board and an outer terminal portion electrically connected to the inner terminal portion and fixed to the socket body so as to protrude outward the socket body, wherein said circuit board is provided with flicker means for flickering the light source at 0.5 to 10 Hz.

* * * * *